(12) United States Patent
Feigl et al.

(10) Patent No.: US 11,272,636 B2
(45) Date of Patent: Mar. 8, 2022

(54) POWER CONNECTION DISTRIBUTOR

(71) Applicant: VERTIV INTEGRATED SYSTEMS GMBH, Arnstorf (DE)

(72) Inventors: Josef Feigl, Arnstorf (DE); Petr Harant, Loucany (CZ); Arthur Huber, Fürstenzell (DE)

(73) Assignee: VERTIV INTEGRATED SYSTEMS GMBH, Arnstorf (DE)

( * ) Notice: Subject to any disclaimer, the term of this patent is extended or adjusted under 35 U.S.C. 154(b) by 0 days.

(21) Appl. No.: 16/955,862

(22) PCT Filed: Oct. 29, 2018

(86) PCT No.: PCT/EP2018/079553
§ 371 (c)(1),
(2) Date: Jun. 19, 2020

(87) PCT Pub. No.: WO2019/120712
PCT Pub. Date: Jun. 27, 2019

(65) Prior Publication Data
US 2020/0337174 A1    Oct. 22, 2020

(30) Foreign Application Priority Data
Dec. 20, 2017 (DE) ...................... 20 2017 107 765.9

(51) Int. Cl.
*H05K 7/14* (2006.01)
*H01R 31/02* (2006.01)
(Continued)

(52) U.S. Cl.
CPC .......... *H05K 7/1492* (2013.01); *H01R 13/68* (2013.01); *H01R 25/006* (2013.01); *H01R 31/02* (2013.01)

(58) Field of Classification Search
CPC .... H05K 7/1492; H01R 13/68; H01R 25/006; H01R 31/02
(Continued)

(56) References Cited

U.S. PATENT DOCUMENTS 4,775,328 A * 10/1988 McCarthy ............ H01R 25/006
439/211
7,043,543 B2 * 5/2006 Ewing ...................... H02B 1/34
(Continued)

FOREIGN PATENT DOCUMENTS

CN         203352167 U     12/2013
WO     WO-2013127121 A1    9/2013

OTHER PUBLICATIONS

International Search Report (in English and German) and Written Opinion of the ISA (in German) issued in PCT/EP2018/079553, dated Jan. 14, 2019; ISA/EP.
(Continued)

*Primary Examiner* — Anatoly Vortman
(74) *Attorney, Agent, or Firm* — Harness, Dickey & Pierce, P.L.C.

(57) ABSTRACT

The invention involves a busbar distributor for electrical energy, and uses at least one consumer terminal (CT) for at least one consumer for supplying the consumer with electrical energy, as well as at least one connecting element for connecting a building energy supply (BES) to at least one high-voltage busbar, which connecting element connects the consumer to the BES. The distributor further has at least one line element which is provided between the connecting element and the CT, and a connector which is arranged between the CT and the connecting element. The connecting element has at least two conductors for supplying power to the CT. Also, the connector is connected, on an energy supply side, to the line element, which is formed having two conductors for energy supply which can be connected to the
(Continued)

BES. The line element is exchangeable depending on the actual voltage and/or the power system of the building energy supply.

10 Claims, 5 Drawing Sheets

(51) Int. Cl.
  *H01R 25/00* (2006.01)
  *H01R 13/68* (2011.01)
(58) Field of Classification Search
  USPC .......................................................... 361/601
  See application file for complete search history.

(56) References Cited

U.S. PATENT DOCUMENTS

| | | | | |
|---|---|---|---|---|
| 7,457,106 | B2* | 11/2008 | Ewing | H01R 25/006 340/635 |
| 7,646,590 | B1* | 1/2010 | Corhodzic | H05K 7/1492 361/641 |
| 7,851,950 | B1* | 12/2010 | Morales | H05K 7/1492 307/147 |
| 7,982,335 | B2* | 7/2011 | Aldag | H01R 25/142 307/12 |
| 8,134,828 | B2* | 3/2012 | Creighton | H02B 1/056 361/644 |
| 8,341,837 | B2* | 1/2013 | Braunstein | H01R 25/006 29/854 |
| 9,166,382 | B2* | 10/2015 | Ewing | H01R 27/02 |
| 9,231,358 | B1* | 1/2016 | Schow | H01R 13/6335 |
| 9,520,043 | B1* | 12/2016 | Alshinnawi | G06F 1/189 |
| 9,627,888 | B2* | 4/2017 | Ewing | H01R 24/76 |
| 9,910,472 | B1* | 3/2018 | Wishman | H05K 7/1492 |
| 10,080,312 | B2* | 9/2018 | Crawford | H04L 41/0803 |
| 10,770,869 | B2* | 9/2020 | Huang | H05K 7/1492 |
| 2008/0309160 | A1* | 12/2008 | Gibson | H05K 7/1492 307/11 |
| 2009/0289500 | A1* | 11/2009 | Zipp | H02J 13/00002 307/31 |
| 2011/0248858 | A1* | 10/2011 | Onodi | H02H 7/261 340/635 |

OTHER PUBLICATIONS

International Preliminary Report on Patentability issued in PCT/EP2018/079553, dated Apr. 2, 2020.

CNIPA 1st Office Action including search report issued in corresponding Application No. 2018800830 dated Mar. 18, 2021.

* cited by examiner

POWER CONNECTION DISTRIBUTOR

CROSS-REFERENCE TO RELATED APPLICATIONS

This application is a 371 U.S. National Stage of International Application No. PCT/EP2018/079553, filed Oct. 29, 2018, and claims priority from German Patent Application 20 2017 107 765.9, filed on Dec. 20, 2017. The entire contents of these applications are incorporated herein by reference in their entirety.

FIELD

The present invention relates to a busbar distributor for electrical energy, and in one implementation to a server cabinet comprising a busbar distributor according to the present disclosure.

In the case of a generic busbar distributor, the following are provided: at least one consumer terminal for at least one consumer for supplying the consumer with electrical energy, at least one connecting element for connection to a building energy supply, in particular to at least one high-voltage busbar, which connecting element connects the at least one consumer to the building energy supply, at least one line element which is provided between the connecting element and the at least one consumer terminal, and a connector which is arranged between the consumer terminal and the connecting element, the connecting element comprising at least two conductors for supplying energy on the consumer side, which conductors are connected in an electrically conductive manner to the at least one consumer.

Owing to the differences that exist in the power supply systems used globally, there is a constant need to provide for compatibility between a consumer and relevant energy supply systems. One of the obstacles that must be overcome in this case relates to the different voltage supplies of the individual power systems. For example, Europe primarily uses a power grid that is operated at 230 V. In contrast, in North America for example, it is conventional to operate consumers at 110 V. A consumer of this kind may be a server cabinet for example, in which individual server modules are provided which can be operated using the same voltage. In addition to different voltages, the lines provided, i.e. for example the phase and neutral conductors, are wired differently, with respect to one another, depending on the power grid.

Depending on the continent for which the consumer, or the server cabinet comprising the server modules, is intended, according to the prior art a current transformer should be provided which regulates the voltage of a building energy supply to the operating level of the consumer or consumers that are adjusted to the locally conventional voltage level and the type of wiring.

It is possible in principle to adjust a supply voltage to the operating voltage of a consumer, for example using transformers. However, this is associated with costs and increased manufacturing complexity.

SUMMARY

The object of the present invention is that of providing a busbar distributor and a server cabinet comprising a busbar distributor, which adjusts the existing actual voltage of a building energy supply and/or of an existing power system to the operating voltage of a busbar distributor or a consumer as required and using simple means.

According to the invention, a busbar distributor of this kind is characterized in that the connector is connected, on the energy supply side, to the at least one line element, which line element is formed in each case having two conductors for energy supply which can be connected to the building energy supply, wherein the line element to be connected to the building energy supply is exchangeable depending on the actual voltage and/or the power system of the building energy supply.

A first basic concept of the present invention consists in adjusting the voltage and/or the supply system of a building energy supply to the operating voltage and/or the power system of a consumer, in particular by means of corresponding wiring. This can be achieved in particular by corresponding wiring or interconnection between the building energy supply and the consumer. In this case, the use of transformers for the purpose according to the invention of voltage adjustment can preferably be omitted because the adjustment of the voltage of the existing power system to an operating voltage of the consumer can already be achieved by corresponding connection of conductors of the building energy supply to conductors of the consumer.

If the consumer is intended to be operated by means of a power system or using an actual voltage that corresponds to the operating voltage thereof, exchanging the line element and/or the connector can achieve transfer of the energy without adjusting the voltage, without it being necessary to exchange the entire busbar distributor.

According to the invention, a building energy supply is intended to mean all electrical energy sources by means of which the busbar distributor according to the invention can be operated using electrical energy. The building energy supply may in particular comprise a public power supply, preferably a high-voltage power supply, a solar installation, a wind turbine and/or a generator powered by a fuel. This list is intended in particular to make it clear that the building energy supply is not restricted by its type of energy generation or provision.

Preferably, in order to adjust the actual voltage to an operating voltage of the consumer, at least two phase conductors of the building energy supply can be connected to the neutral conductor or the phase conductor of the consumer.

According to an advantageous development of the present invention, the connector is formed having at least one fuse in each case for each line for energy supply. In principle, a neutral conductor provided on the consumer side does not require an additional fuse. However, since this can be connected to two phase conductors in the event of adjustment to a power system, it may be expedient to individually fuse the two conductors that lead from the distributor to the at least one consumer terminal.

According to a preferred development of the present invention, the connector is formed having a plurality of terminals for line elements, wherein provided energy is adjustable for the at least one consumer and/or a number of active consumer terminals. Each connection between the connector and building energy supply provides additional energy for the busbar distributor. It is thus possible, for example, to provide the at least one consumer with twice the energy at the consumer terminal by means of connecting the connector and building energy supply using two line elements. It is also possible for additional consumers to be supplied with energy, i.e., for the number of consumer terminals to be increased, by using a plurality of line elements between the connector and the building energy supply.

An expedient development of the present invention consists in a standardized, releasable plug connection being provided between the connector and each of the exchangeable line elements. The above-described alternative wiring of the neutral conductor and phase conductor of the consumer together with two phase conductors of the building energy supply, which wiring ultimately leads to adequate voltage supply for the consumer in the case of different energy systems between the building energy supply and the consumer, can already be provided in the line element. The line element can be made exchangeable by releasing the plug connection to the connector. As a result, it is possible to adjust the line element to the existing actual voltage of the building energy supply or to adjust the actual voltage to the consumer voltage, as required.

The preferably standardized design of the plug connection between the connector and the line element means that no special knowledge of the relevant peculiarities of the existing power system is required. Simple labelling of the individual exchangeable line elements, for example using a country abbreviation or an indication of the actual voltage or the suitability of said line element for a particular power system allows all users to adjust the busbar distributor to the relevant building energy supply.

The plug connection between the line element and the connector is preferably of a shape and/or geometry that allows for just one type of connection between the two parts. In this case, the plug connection may, for example, be formed having a number of plug connection elements which are, for example, connected to one line of the building energy supply in each case. The corresponding arrangement and/or wiring of the plug connection elements in the plug connection thus makes it possible for example for a phase conductor of the building energy supply to be connected to a phase conductor of the consumer or, equally, to a neutral conductor of the consumer, in a pre-defined manner. It is thus possible, for example, for a phase conductor of the building energy supply to be connected by means of a first line segment to a line that leads to a connected consumer, and for a neutral conductor of the building energy supply to be connected by means of a second line segment to a second line that leads to the same connected consumer.

This would provide, for example, a power supply that is conventional for Europe, in which the consumer is connected to one phase conductor and to the neutral conductor.

The meaningful exchange of the line element makes it possible, for example, for two lines for supplying energy to at least one consumer to be connected to a total of two phase conductors of the building energy supply, i.e., for one conductor to be connected to one phase conductor in each case.

Since the voltage of a phase conductor fluctuates periodically between a maximum and a minimum, in particular a negative minimum, with respect to a potential earth that is provided, the periodicity of the individual phase conductors being offset with respect to one another, connecting a consumer to two phase conductors of the building energy supply makes it possible to provide a voltage, on the consumer side, that is higher than the maximum actual voltage of one phase conductor with respect to the potential earth.

According to a development of the invention, it is particularly expedient for the connector to be able to be connected to a plurality of consumer terminal segments, energy being adjustable for the at least one consumer and/or a number of active consumer terminals. In principle, active consumer terminals may be those that are connected to the building energy supply by means of the connector and the line element. Each consumer terminal segment may be formed having at least one consumer terminal, the consumer terminal segment preferably being able to be releasably connected to the connector. The connector can therefore comprise terminals for line elements and/or terminals for consumer terminal segments. As a result, the number of consumer terminals and line elements can be adjusted as required.

According to a particular development of the present invention, more than one line element can be connected to the connector by means of the same plug connection. It is conceivable, in principle, to combine two or more line elements in one plug connection or one terminal on the connector. As a result, it is possible for example to provide the busbar distributor with more energy, preferably twice the energy, in the case of two connected lines, only one terminal on the distributor being occupied.

Particularly preferably, according to a development of the invention, the at least one plug connection comprises wiring that supplies energy to at least one first consumer terminal, or comprises wiring that in addition supplies energy to at least one second consumer terminal. In principle, the phase conductors provided by the building energy supply can be divided over a plurality of consumer terminals in the connector. It is thus possible, for example, for any desired number of consumer terminals or consumers connected to the consumer terminals to be supplied with energy by means of one or two phase conductors. Division or distribution of the individual phase conductors of the building energy supply over a plurality of consumer terminals can already take place in the line element, for example by means of a number of plug connection segments. It is thus possible, for example, for consumer terminals 1 to 10 to be supplied with energy by means of a first phase conductor or a first phase conductor pair, the consumer terminals 11 to 20 of the busbar distributor being supplied with energy by means of a second phase conductor or a second phase conductor pair.

The line element and/or the connector may comprise a wiring that assigns or connects one phase conductor or one phase conductor pair to a specified number of consumer terminals in order to supply said consumer terminals with energy. If the consumer is intended to be supplied with as much energy as possible, it may be expedient to provide one phase conductor or one phase conductor pair just for one or for a small number of consumers. If, in contrast, it is preferable to supply as large as possible a number of consumers with energy, the line element and/or the connector may in each case connect one phase conductor or one phase conductor pair to a plurality of consumers or consumer terminals.

In principle, the connector can be wired such that a plurality of consumers or consumer terminals can be supplied with energy from the building energy supply. Using a line element in which for example only a limited number of the provided plug connection segments are actually occupied by wiring makes it possible to adjust or reduce the actual number of consumer terminals that are supplied with energy. Consequently, the at least one first consumer terminal or the additional at least second consumer terminal may also be a first or a second group, respectively, or consumer terminals.

It is particularly preferable, according to a development of the invention, for the connector to be formed integral with the line element. In the case of a change of the energy supply system, which may in particular be associated with change in the supply voltage, the connector can accordingly be provided so as to be exchangeable together with the line element. As a result, it is also possible in particular for a number of provided fuses for the individual lines or for a necessary fuse type to be adjustable, as required, to the power system in question. A releasable connection may preferably be provided between a consumer terminal segment, comprising at least one consumer terminal, and the connector.

According to an expedient development of the present invention, the connector is formed integrally with the at least one consumer terminal. Accordingly, a busbar distributor would be provided which is preferably formed merely having at least one releasable connection between the connector and the line element. In this case, the division of the individual phase conductors or phase conductor pairs over the individual consumer terminals of the busbar distributor can again take place in the line element and/or the connector, the plug connection segments between the line element and the connector interacting in the manner described above.

According to the explanations above, the present invention is in particular directed to providing a busbar distributor that adjusts an actual voltage of an existing power system of the building energy supply to a target voltage for the consumer merely by exchanging a line element, preferably a connection cable, between the building energy supply and the connector. The actual voltage and the target voltage are in particular standard power supply systems or energy supply systems, as are standardized in particular nationally or regionally.

The server cabinet according to the invention is characterized in that it is formed comprising a busbar distributor according to the invention. In this case, the server cabinet may be formed comprising individual server modules that require a standardized power supply in order to function properly. Said power supply may be 230 V for example. Providing the busbar distributor according to the invention in the server cabinet makes it possible for an approximately constant voltage to be provided for the consumers in the server cabinet, irrespective of whether the building energy supply is at 110 V or 230 V, for example by simple exchange of one line element, in particular a cable, that is connected to the building energy supply.

A server cabinet is usually designed comprising what are known as 19-inch regions in which the individual server modules, i.e. the consumers of the server cabinet, can be provided. The 19-inch region is usually provided inside the server cabinet. A gap may be provided between at least one wall of the server cabinet and the 19-inch region, in which gap the consumer terminals for the individual server modules can be arranged. This is preferably what is known as a power strip which is formed comprising a plurality of busbars, i.e. consumer terminals for the individual server modules.

The connector which connects the consumer terminals to the building energy supply may be provided both in the 19-inch region and outside the 19-inch region. If the distributor is provided in the 19-inch region, said distributor occupies at least what is known as a height unit, according to which the height requirement of the individual server modules in the 19-inch region is measured. By providing the distributor outside the 19-inch region it is made possible for additional space to be provided in the server cabinet for further server modules.

The busbar distributor according to the invention or the server cabinet according to the invention thus allows for pre-assembly of the server cabinet together with the modules thereof irrespective of a country-specific energy supply, wherein only the relevant line element suitable for the corresponding power system is able to be attached to the terminal. Said line element can ultimately provide the voltage suitable for the energy required.

BRIEF DESCRIPTION OF DRAWINGS

The present invention will be explained in more detail in the following, with reference to the accompanying drawings. In the drawings.

DETAILED DESCRIPTION

Figure 1A:
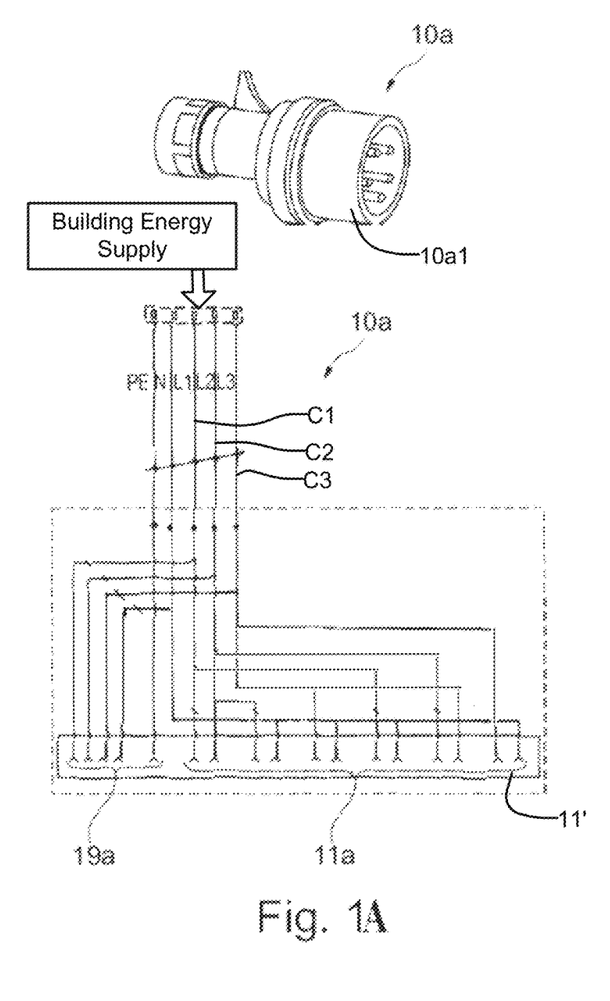
FIG. 1A shows a first wiring variant of the line element according to the invention and its associated wiring diagram.
Figure 1B:
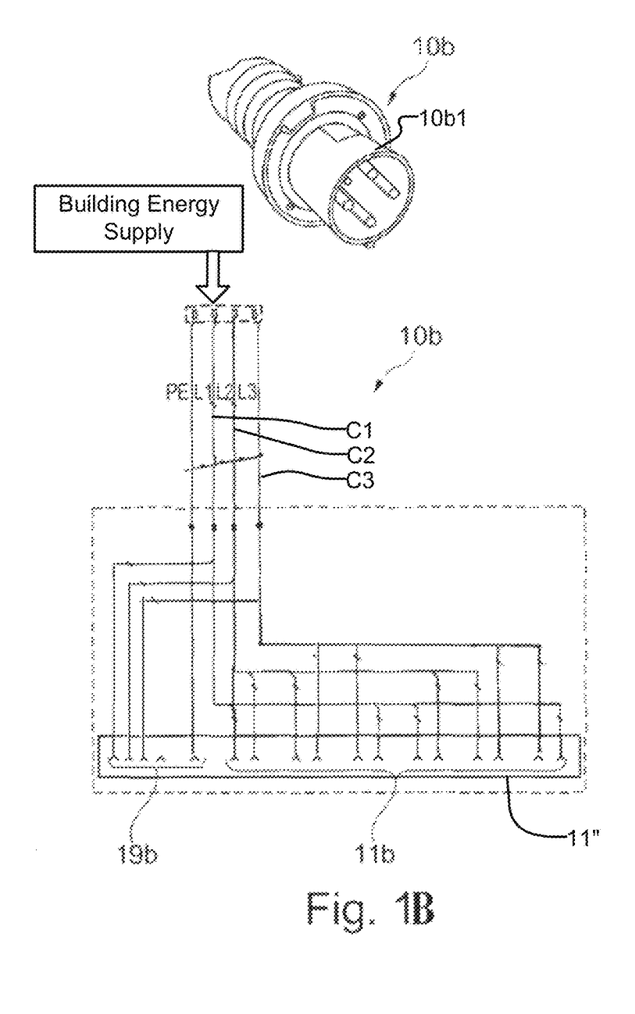
FIG. 1B shows a second wiring variant of the line element, and its associated wiring diagram, according to the invention.
Figure 3A:
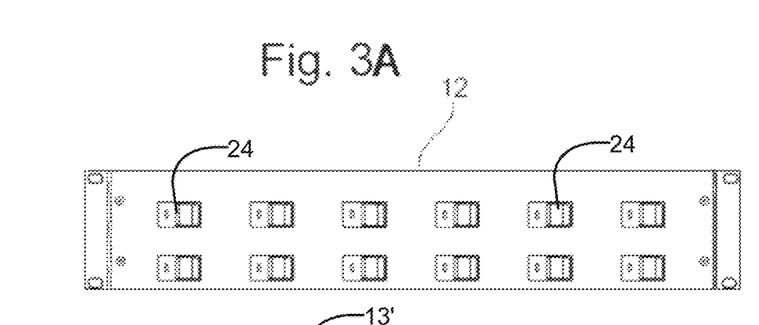
FIG. 3A is a front and rear view of an embodiment of the distributor according to the invention.
Figure 3B:
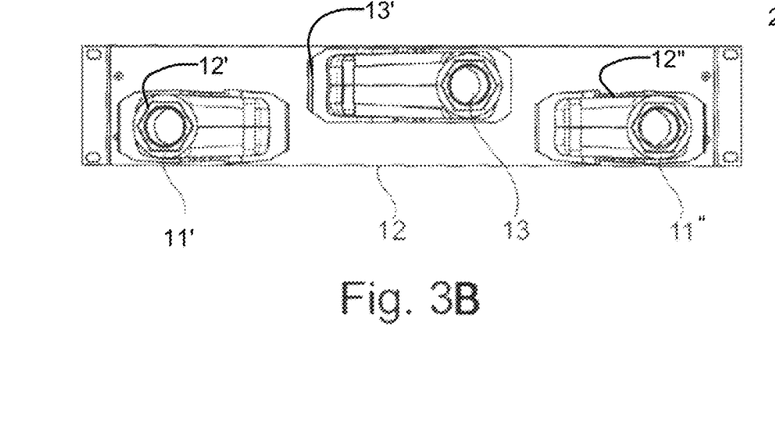
FIG. 3B is a rear view of an embodiment of the distributor according to the invention.
Figure 4:
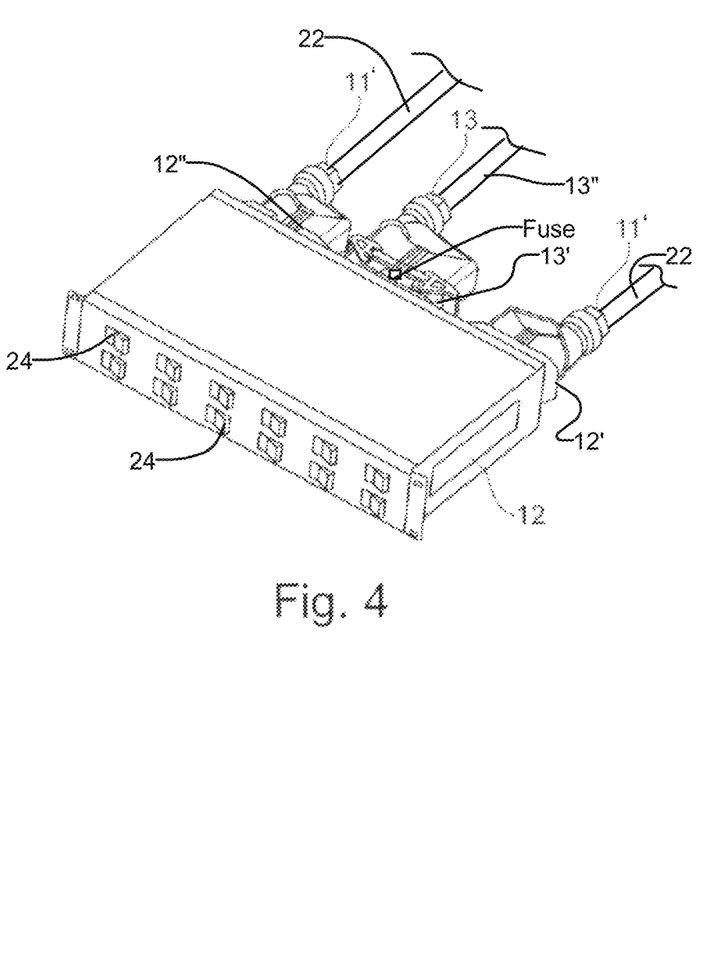
FIG. 4 is a perspective view of an embodiment of the distributor according to the invention.

FIGS. 1A and 1B show line elements 10*a* and 10*b* in accordance with two embodiments according to the invention, which embodiments are 3-phase in each case and are shown together with associated wiring diagrams, and which form two different cabling assemblies. The line element 10*a* of FIG. 1A comprises an Earth potential conductor (hereinafter "PE-conductor"), 3 phase conductors and a neutral conductor, as is used for example in Europe in the case of a high-voltage busbar. Accordingly, a first connecting element formed by a plug 10*a*1 for the FIG. 1A line element 10*a* is formed having 5 contacts. The FIG. 1B embodiment of the line element 10*b* comprises a PE-conductor and 3 phase conductors, as is used for example in a high-voltage busbar in North America. Accordingly, a second connecting element formed by a plug 10*b*1 for the FIG. 1B line element 10*b* is formed having 4 contacts. A cable portion of the two embodiments of the line elements 10*a* and 10*b* is not shown for reasons of clarity. The cable portions are to be provided at an opposing end of the 4 or 5 contacts, and lead to a connector as is shown in FIGS. 3 and 4, for example.

A wiring diagram is shown below each line element 10*a* and 10*b* in FIGS. 1A and 1B, which shows possible wiring within each line element 10*a* and 10*b*. The number of contacts (4 or 5 contacts) that the plug 10*a*1 or 10*b*1 in question comprises is shown in a top region of each wiring diagram of FIGS. 1A and 1B. In the case of the first embodiment (10a), the contacts are designated, from left to right, by "PE", "N", "L1", "L2" and "L3". In principle, PE stands for the Earth potential conductor (hereinafter "PE conductor"), N for the neutral conductor, and L1 to L3 for the individual phase conductors, as they are connected to the building energy supply.

In the case of the second embodiment (10b), the conductors connected to the contacts "PE", "L1", "L2" and "L3" "are designated C1", "C2" and "C3", correspondingly, and are consistent across the embodiments.

The bottom end of each wiring diagram shows the wiring of a plug 11 (i.e., plug 11' in FIG. 1A and plug 11" in FIG. 1B) on the connector side, which plug 11' or 11" can be connected to a connector 12, to be discussed in connection with FIGS. 3 and 4. As can be seen from the individual wiring diagrams, the wiring can be divided, on the connector side (i.e., at plugs 11' and 11"), into two groups 11a and 19a at plug 11', and 19b and 11b at plug 11". The conductor groups of two conductors in each case, belonging to group 11, each connect a consumer to the building energy supply. The conductors belonging to groups 19a and 19b comprise the potential earth or an energy supply for the distributor. In principle, the PE conductor can also be guided as far as the relevant consumers. In such a case, PE would belong to group 11. The energy supply for the distributor can optionally be predictable, and may for example be provided for an electronic controller, by means of which energy input to the individual consumer terminals or to groups of consumer terminals can be activated or deactivated.

As is clear from a direct comparison of the wiring diagrams in FIGS. 1A and 1B, the line element as is used in Europe for example according to embodiment 10a, comprises a connection to the neutral conductor and to one phase conductor of the building energy supply for each consumer. The 4-pin embodiment according to embodiment 10b connects each consumer to 2 phase conductors of the building energy supply. If embodiment a) is then operated at 230 V and embodiment 10b is operated at 110 B, approximately the same voltage is provided on the consumer side. The slight differences in the provided voltage between the two examples cited are negligible, in particular when operating a server cabinet by means of the busbar distributor according to the invention.

Figure 2A:
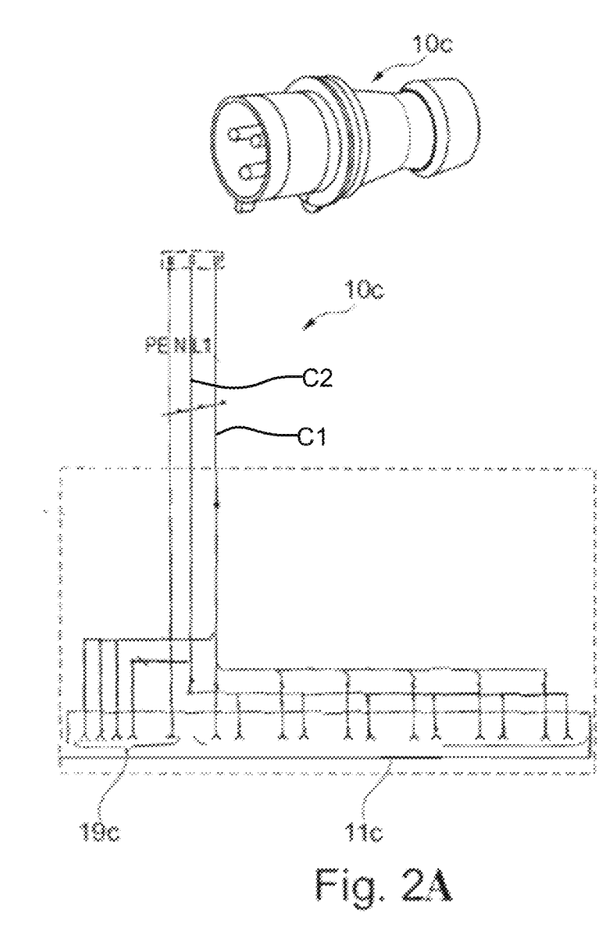
FIG. 2A shows a third and fourth wiring variant of the line element according to the invention.
Figure 2B:
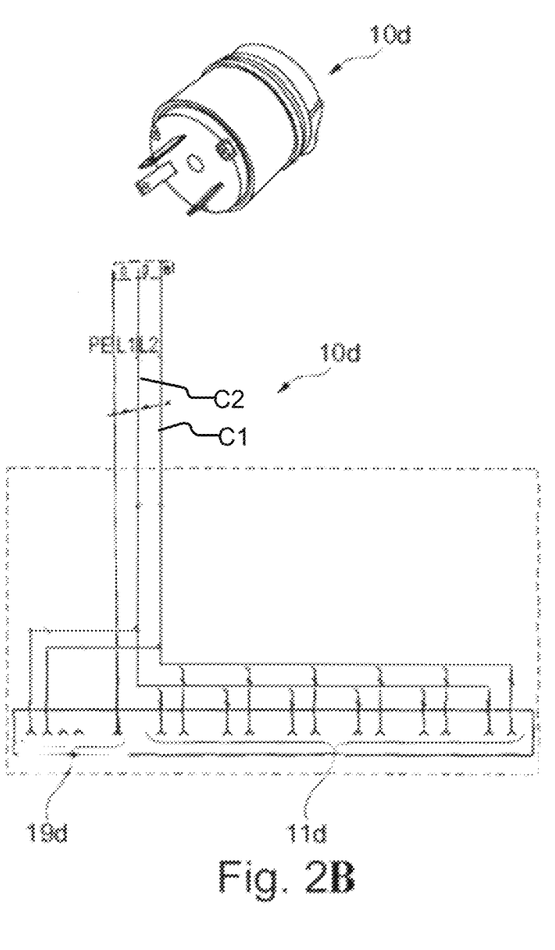
FIG. 2B shows a fourth wiring variant of the line element according to the invention.

FIGS. 2A and 2B show two further embodiments 10c and 10d and their associated wiring diagrams, which each show a 3-pin embodiment of the line element 10. According to FIGS. 2A and 2B, for reasons of clarity again in each case only the plug for the corresponding system is shown, while the energy-conducting cable is not shown. According to embodiments 10c and 10d, the same plug connection 11 of the line element 10 to the connector 12 as has already been described with reference to FIGS. 1A and 1B is preferably provided on the connector side.

Embodiment 10c again comprises a connection to the PE conductor, the neutral conductor and a phase conductor of the building energy supply. Said embodiment can therefore preferably be connected to a 240 V building energy supply. According to embodiment 10c, a phase conductor is divided in the line element such that the phase conductor supplies energy to a plurality of terminals 11c for consumers. Each terminal for a consumer comprises a contact to the neutral conductor of the building energy supply and the one phase conductor. In addition, a power supply 19c for the distributor 12 can again be provided. This may be used for the same purpose as has already been described with reference to FIGS. 1A and 1B.

Embodiment 10d according to FIG. 2B comprises a connection to the PE conductor and to two phase conductors L1 and L2 of the building energy supply. Corresponding wiring divides the two phase conductors such that said phase conductors can each be connected to a plurality of consumers; six according to embodiment 10d. According to embodiment 10d an energy supply 19d for the distributor 12 is also provided, which energy supply can be provided for the same function as has already been described with reference to FIGS. 1A and 1B. In principle, the energy supply for the distributor is not necessary, for example if an electronic circuit for activating consumer terminals is omitted.

The plug connection between the plug 11 and the distributor 12 is preferably formed in a standardized manner, irrespective of which line element 10a to 10d is connected to the distributor 12. The standardized plug connection between the plug 11 and the distributor 12 is also possible when a different building energy supply, not described above, is connected to the busbar distributor according to the invention.

According to the invention, the busbar distributor is in particular a combination of at least one line element, a connector and at least one consumer terminal, as has been described with reference to FIG. 5 or 6, respectively.

FIGS. 3A and 3B are a front and rear views, respectively, according to a preferred embodiment of a busbar distributor 12. In the present case, the busbar distributor 12 comprises a housing having two terminals 12' and 12" for line elements 10 in which, according to FIGS. 3A and 3B, a plug 11' of the line element 10 is already inserted. The plugs 11' that are connected to the distributor 12 are also shown in FIG. 4. According to the invention, the free ends of the plugs 11' in FIGS. 3A, 3B and FIG. 4 comprise a conductor according to the invention, in particular at least one cable 22 as shown in FIG. 4, which connects the relevant plug 11' to the power plug according to FIG. 1A, 1B, 2A, or 2B (e.g., to power plug 10a1 in FIG. 1A). The plug 11', cable 22 and power plug 10a1 or 10a2 can thus form the line element 10a or 10b.

A multi-pin connection consisting of male plug segments and female openings for the segments preferably exists between the relevant plug 11 and the terminal 12' or 12" on the distributor 12 for the plug 11. The individual plug segments may each comprise individual line segments, as are shown for example in FIGS. 1A, 1B, 2A and 2B, in region 11a to 11d. The division of the individual phase conductors or the individual phase conductor over the terminals for the relevant consumers can thus already be divided up in the line segment, wherein it is possible for each plug segment of a line segment to connect said line segment to a consumer. A plug segment is shown schematically in FIGS. 1A, 1B, 2A and 2B by means of a pair of lines of group 11 (plug 11) in each case. Correspondingly variable allocation of plug segment positions in the plug 11 to a phase conductor, a neutral conductor or a potential earth makes it possible to easily connect a consumer to for example one or two phase conductors of the building energy supply.

At least one switch 24 may be provided on a front face of the distributor 12, by means of which the power from the building energy supply to a consumer can be interrupted or established. According to the embodiment according to FIG. 3, 12 of such switches are provided, wherein each of the switches is able to separate one terminal for a consumer or a group of terminals for consumers from the building energy supply and/or to connect said terminal or terminals thereto.

A further terminal 13' is provided on the rear face of the distributor 12, in which terminal 13' a further plug 13 is arranged. Said plug 13 releasably connects the individual consumer terminals to the distributor 12 by means of corresponding lines. In principle, the terminal 13', as an element between the plug 11 and the plug 13, may simply be a means for transferring energy without changing the internal wiring. One fuse is preferably provided in each case for each line. Particularly preferably, each of the lines comprises a separate fuse.

The plug connection between the terminal 13' and the plug 13 may differ, in particular in terms of geometry, from the terminal 12' connection between the connector 12 and the plug 11' as shown in FIG. 3B. This can guard against incorrect connection of the individual plugs 11, 13 to the terminals 12' and 12" of the distributor 12.

Figure 5:
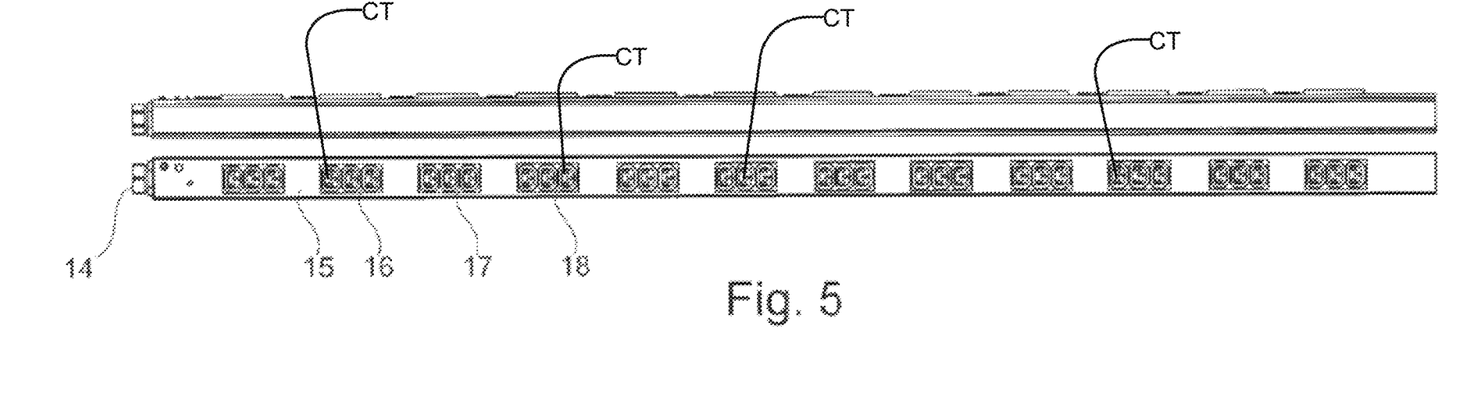
FIG. 5 is a side view and a plan view of an embodiment of a group of consumer terminals according to the invention.

A socket 14, associated with a power strip 15 having a plurality of consumer terminals CT, may be provided at the other end of the lines connected to the plug 13, as can be seen for example in FIG. 5. According to the embodiment shown in FIG. 5, the socket 14 is arranged on the power strip 15 in spaced apart groups of three consumer terminals CT in each case, as designated by way of example by the numbers 16, 17 and 18. Each group of consumer terminals CT may comprise any desired number of consumer terminals CT. This also includes just one consumer terminal CT per group. In principle, any desired number of consumer terminal groups can be provided on the power strip 15. Consumers can be connected to the power strip of the busbar distributor 12 according to the invention by means of the individual consumer terminals.

Figure 6:
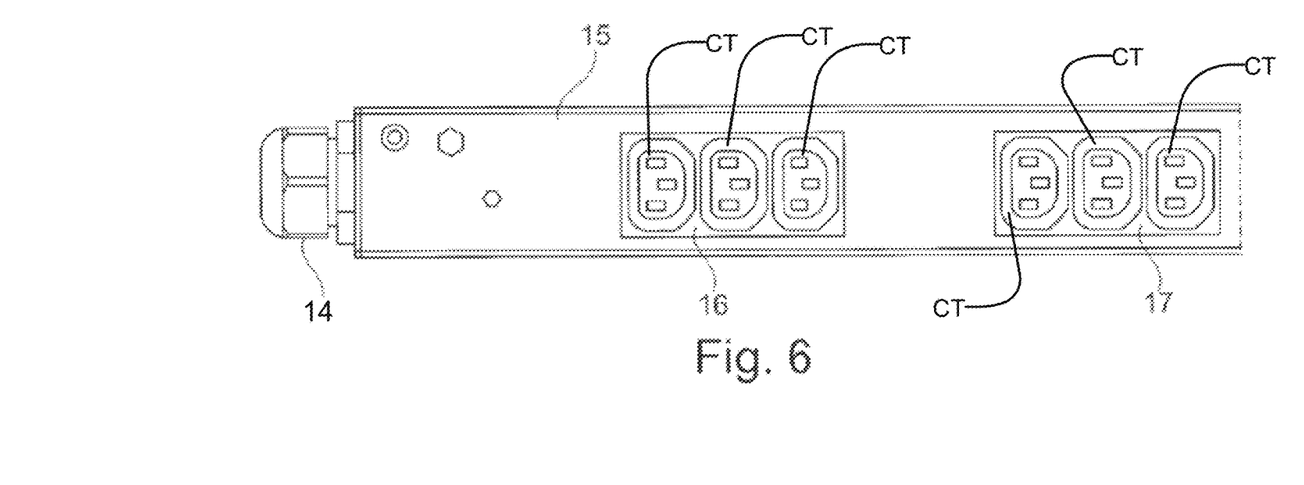
FIG. 6 is an enlarged view of a detail of the plan view of a group of consumer terminals according to the invention, according to FIG. 5.

FIG. 6 shows an enlarged detail of the power strip 15 according to the invention. The drawing shows two groups 16 and 17 of three consumer terminals CT in each case, which terminals can be connected to or separated from the building energy supply, for current carrying, by means of a corresponding switch, such as one of switches 24 arranged on the front face of the distributor 12 as shown in FIG. 3, without a line or a cable needing to be detached or connected for this purpose.

Figure 7:
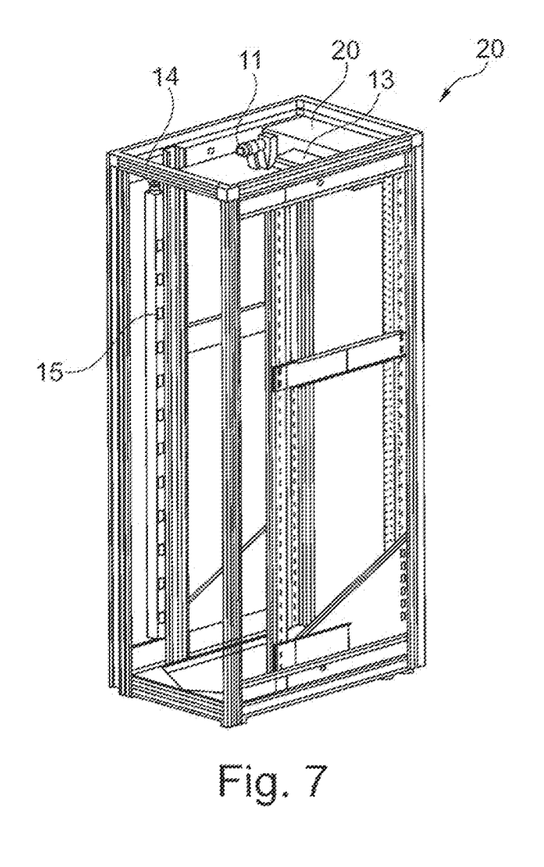
FIG. 7 is a perspective side view of an embodiment of the server cabinet according to the invention, comprising an in-built distributor, in-built consumer terminals, and a plug connection of a line element according to the invention for a connection between the distributor and the consumer terminals, and a plug connection between the distributor and the building energy supply.

FIG. 7 is a perspective view of a server cabinet 20 according to the invention. The server cabinet 20 is formed comprising the busbar distributor 12 according to the invention. The busbar distributor 12 is provided in what is known as a 19-inch region of the server cabinet 20. The individual server modules, which may be consumers in a server cabinet, can be arranged in said region. The power strip 15 is provided outside the 19-inch region, so as to be laterally vertical, said power strip comprising consumer terminals CT for the individual consumers (e.g., server modules) in the server cabinet 20. In principle, the busbar distributor 12 may also be provided outside the 19-inch region, as a result of which additional space is provided for server modules.

Figure 8:
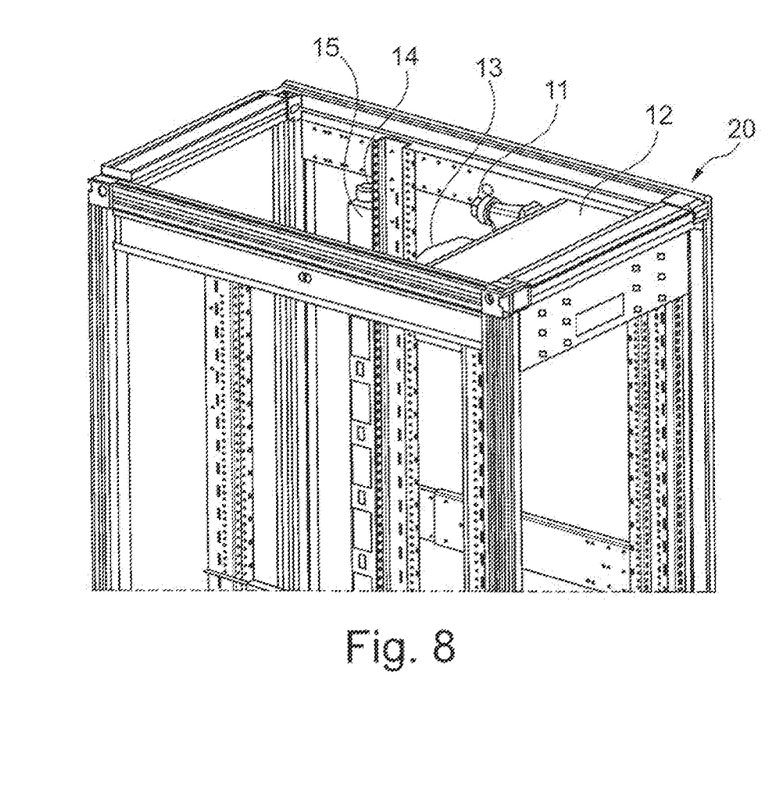
FIG. 8 is a perspective view of a top region of the server cabinet according to the invention.

FIG. 8 is an enlarged perspective view of a region of the server cabinet 20 comprising the busbar distributor 12 arranged in the 19-inch region and the power strip 15 arranged outside the 19-inch region. For reasons of clarity, in both FIG. 7 and in FIG. 8 the busbar distributor 12 is shown without cable portions between the building energy supply and the busbar distributor 12, or between the busbar distributor 12 and the power strip 15. The individual plugs 11 and 13, and the socket 14 on the power strip 15, as have already been described above, are also shown in FIGS. 7 and 8. The energy-conducting connection between the building energy supply, the busbar distributor 12 and the power strip 15 can be provided in the same manner, according to FIGS. 7 and 8, as has already been explained above with reference to the plugs 11 and 13 and/or with reference to the socket 14.

The invention claimed is:

1. A busbar distributor system for distributing electrical energy, comprising
    at least one consumer terminal (CT) for supplying electrical energy to an electrically powered consumer device;
    first and second differing connecting elements for connection with a building energy supply, wherein the first and second connecting elements each have a pair of conductors and are each configured to connect the at least one consumer to the building energy supply;
    first and second line elements each having two conductors and each being adapted to be provided between one of the first or second connecting elements and the at least one consumer terminal, wherein the first connecting element is coupled to the first line element to form a first cable subassembly to implement a first wiring configuration, and the second connecting element is coupled to the second line element to form a second cable subassembly to implement a second wiring configuration different from the first wiring configuration;
    a cable in electrical communication at a first end with the at least one consumer terminal;
    a busbar distributor arranged between the consumer terminal and a selected one of the first or second cable subassemblies, on an energy supply side thereof, for receiving electrical power from the building energy supply, through the selected one of the first or second cable subassemblies;
    the busbar distributor further being connected to a second end of the cable, to supply power received from the building energy supply via the selected one of the first or second cable subassemblies, to the at least one consumer terminal (CT);
    wherein either the first cable subassembly or the second cable subassembly is selected for use to implement either the first wiring configuration or the second wiring configuration, as needed to match the building energy supply to a power requirement of the at least one consumer terminal (CT).

2. The busbar distributor system of claim 1, wherein the busbar distributor is formed having at least one fuse for each line for energy supply.

3. The busbar distributor system of claim 1, wherein the busbar distributor is formed having a plurality of terminals for a corresponding plurality of the line elements, wherein a provided energy is adjustable for the at least one consumer and/or a number of active consumer terminals.

4. The busbar distributor system of claim 1, further comprising a standardized, releasable plug connection provided in part on the busbar distributor, for enabling coupling with each of the first or second line elements.

5. The busbar distributor system of claim 1, wherein the busbar distributor is connected to a plurality of the consumer terminals, wherein energy is adjustable for the at least one consumer and/or a number of active consumer terminals.

6. The busbar distributor system of claim 1, wherein more than one said line element can be connected to the busbar distributor by means of a common plug connection.

7. The busbar distributor system of claim 1, wherein the cable includes at least one plug connection comprises a wiring that supplies energy to at least one first consumer terminal, or comprises a wiring that in addition supplies energy to at least one second consumer terminal.

8. The busbar distributor system of claim 1, wherein the busbar distributor is formed with either the first or second ones of the line elements.

9. The busbar distributor system of claim 1, wherein the busbar distributor is formed integrally with the at least one consumer terminal.

10. The busbar distributor of claim 1, further comprising a server cabinet for at least partially housing the busbar distributor.

\* \* \* \* \*